(12) United States Patent
Xia

(10) Patent No.: US 10,692,937 B2
(45) Date of Patent: Jun. 23, 2020

(54) MANUFACTURING METHOD OF OLED DISPLAY PANEL WITH STACKS STRUCTURE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Cunjun Xia, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 32 days.

(21) Appl. No.: 15/740,261

(22) PCT Filed: Nov. 23, 2017

(86) PCT No.: PCT/CN2017/112589
§ 371 (c)(1),
(2) Date: Aug. 24, 2018

(87) PCT Pub. No.: WO2019/085078
PCT Pub. Date: May 9, 2019

(65) Prior Publication Data
US 2019/0386071 A1 Dec. 19, 2019

(30) Foreign Application Priority Data
Nov. 3, 2017 (CN) .......................... 2017 1 1076182

(51) Int. Cl.
*H01L 27/32* (2006.01)
*H01L 51/56* (2006.01)
(Continued)

(52) U.S. Cl.
CPC ...... *H01L 27/3209* (2013.01); *H01L 27/3246* (2013.01); *H01L 27/3283* (2013.01);
(Continued)

(58) Field of Classification Search
CPC ........................ H01L 27/3209; H01L 27/3225
See application file for complete search history.

(56) References Cited

U.S. PATENT DOCUMENTS 7,663,140 B2 * 2/2010 Yamazaki ........... H01L 27/3209
257/40
2005/0140275 A1 6/2005 Park
(Continued)

FOREIGN PATENT DOCUMENTS

CN 105762171 A 7/2016

*Primary Examiner* — Quoc D Hoang
(74) *Attorney, Agent, or Firm* — Hemisphere Law, PLLC; Zhigang Ma

(57) ABSTRACT

The present disclosure discloses an OLED display panel and a manufacturing method thereof, including: forming a first anode layer on a substrate; forming a conductive layer, a first pixel defining layer and a protective layer covering the conductive layer on the first anode layer; forming a first OLED pixel layer on the first anode layer; forming a first cathode layer on the OLED pixel layer; forming a second anode layer on the first cathode layer; forming a second OLED pixel layer on the second anode layer; and forming a second cathode layer on the second OLED pixel layer. In the above way, the times of the precision mask used in the manufacturing process is greatly reduced, and the space occupied by the stack structure in parallel with the three primary colors is greatly reduced, thereby greatly improving the pixel resolution.

12 Claims, 4 Drawing Sheets

(51) Int. Cl.
*G09G 3/20* (2006.01)
*G09G 3/3208* (2016.01)

(52) U.S. Cl.
CPC .......... *H01L 51/56* (2013.01); *G09G 3/2003* (2013.01); *G09G 3/3208* (2013.01)

(56) References Cited

U.S. PATENT DOCUMENTS

| | | |
|---|---|---|
| 2007/0114522 A1 | 5/2007 | Kwok et al. |
| 2011/0095702 A1 | 4/2011 | Lee et al. |
| 2013/0140589 A1 | 6/2013 | Kwak |
| 2015/0144935 A1 | 5/2015 | Kim et al. |
| 2016/0020421 A1 | 1/2016 | Joo et al. |
| 2016/0293676 A1* | 10/2016 | Komatsu .................. G02B 5/20 |
| 2017/0092871 A1 | 3/2017 | Kim et al. |
| 2018/0190728 A1 | 7/2018 | Wu et al. |

\* cited by examiner

MANUFACTURING METHOD OF OLED DISPLAY PANEL WITH STACKS STRUCTURE

RELATED APPLICATIONS

The present application is a National Phase of International Application Number PCT/CN2017/112589, filed Nov. 23, 2017, and claims the priority of China Application No. 201711076182.0, filed Nov. 3, 2017.

FIELD OF THE DISCLOSURE

The present disclosure relates to a display technology field, and more particularly to an OLED display panel and a manufacturing method thereof.

BACKGROUND OF THE DISCLOSURE

With the advent of the information age, display technology has been constantly updated. OLED (organic electroluminescent display) display technology with ultra-fast response speed and slim advantages have been tremendous development.

The display of the currently OLED panel is usually the following three ways: RGB parallel pixel independent light, light color conversion and color filter and so on.

Red, green and blue (RGB) pixels emit light independently: using FMM (Fine Metal Mask) and CCD (Charge-coupled Device). First of all, preparing red, green and blue primary color luminescent centers, and then adjusting the color mixing ratio of the three-color combinations to produce a color so that the three-color OLED element emits light independently to form one pixel. The key of this technology is to improve the color purity and luminous efficiency of luminescent materials, meanwhile, the technology of metal shadow mask etching is also very important. With the OLED display colorization, high resolution and large area, the metal shadow mask etching technology directly affects the quality of the display panel screen, so the metal shadow mask graphics dimensional accuracy and positioning accuracy made more stringent requirements.

Light color conversion: combining a blue OLED with a light color conversion film array, preparing a device emitting blue OLEDs, and then exciting the light color conversion materials to obtain red light and green light by using the blue light, thus obtaining full color. The key of this technology is to improve the color purity and efficiency of light color conversion materials. This technique eliminates the need for FMM and alignment techniques, requiring only blue OLED elements to be evaporated. However, its disadvantage is that the light color conversion material easily absorbs the blue light in the environment, causing the contrast of the image to decrease, and the light guide also causes the problem of the picture quality being degraded.

Color filter: use of white OLED combined with color filter, similar to the liquid crystal display color filter film production technology. First preparing white OLED devices, and then getting the three primary colors through the color filter, combining with the three primary colors to achieve color display. The key to this technology is to get white light with high efficiency and high purity. Its production process without FMM and registration technology, but the use of this technology through the color filter caused by the loss of up to two-thirds.

Now the mainstream of the OLED panel display type is red, blue and green three primary color pixels in the same side of the panel side by side distribution, through the control of the drive circuit to achieve the screen display. Such display modes increase the pixel resolution by compressing the pixel arrangement space, and now the common red, blue and green three-color pixel independent light-emitting preparation process needs five FMM and CCD processes. This brings the complex process, low yield, high preparation costs and other issues.

SUMMARY OF THE DISCLOSURE

The technical problem to be solved by the present disclosure is to provide an OLED display panel and a manufacturing method thereof, which can reduce process complexity and production cost by a stacks structure.

In order to solve the above technical problem, the present disclosure provides a manufacturing method of an OLED display panel, including the steps of:

forming a first anode layer on a substrate; forming a conductive layer on the first anode layer, wherein a first end of the conductive layer is electrically connected to the first anode layer; forming a first pixel defining layer on the periphery of the conductive layer; covering a second end of the conductive layer with a protective layer; forming a first OLED pixel layer on the first anode layer; forming a first cathode layer on the first OLED pixel layer; forming a second anode layer on the first cathode layer; forming a second OLED pixel layer on the second anode layer; removing the protective layer; forming a second pixel defining layer; and forming a second cathode layer on the second OLED pixel layer, so that the second cathode layer is electrically connected to the first anode layer through the conductive layer.

In order to solve the above technical problem, the present disclosure also provides a manufacturing method of an OLED display panel, including the following steps: forming a first anode layer on a substrate; forming a conductive layer, a first pixel defining layer and a protective layer covering the conductive layer on the first anode layer; forming a first OLED pixel layer on the first anode layer; forming a first cathode layer on the OLED pixel layer; forming a second anode layer on the first cathode layer; forming a second OLED pixel layer on the second anode layer; and forming a second cathode layer on the second OLED pixel layer, so that the second cathode layer is electrically connected to the first anode layer through the conductive layer.

In order to solve the above problem, the present disclosure also provides an OLED display panel, including: a substrate, and a first anode layer, a conductive layer, a first pixel defining layer, a first OLED pixel layer, a first cathode layer, a second anode layer, a second OLED pixel layer and a second cathode layer formed on the substrate sequentially, wherein the second cathode layer is electrically connected to the first anode layer through the conductive layer.

The beneficial effects of the present disclosure are: different from the prior art, in the present disclosure, the first OLED pixel layer is alternately arranged with two colors of the three primary colors and the second OLED pixel layer is the other one of the three primary colors through the stack structure. At the same time, the OLED display panel is driven by the mode of driving the display of the pixel stack. In the above way, the times of FMM used in the manufacturing process is greatly reduced, the process complexity and cost are reduced, and the product yield is improved. At the same time, the space occupied by the stack structure relative to the three primary colors is drastically reduced, greatly improving the pixel resolution.

DETAILED DESCRIPTION OF PREFERRED EMBODIMENTS

Figure 1:
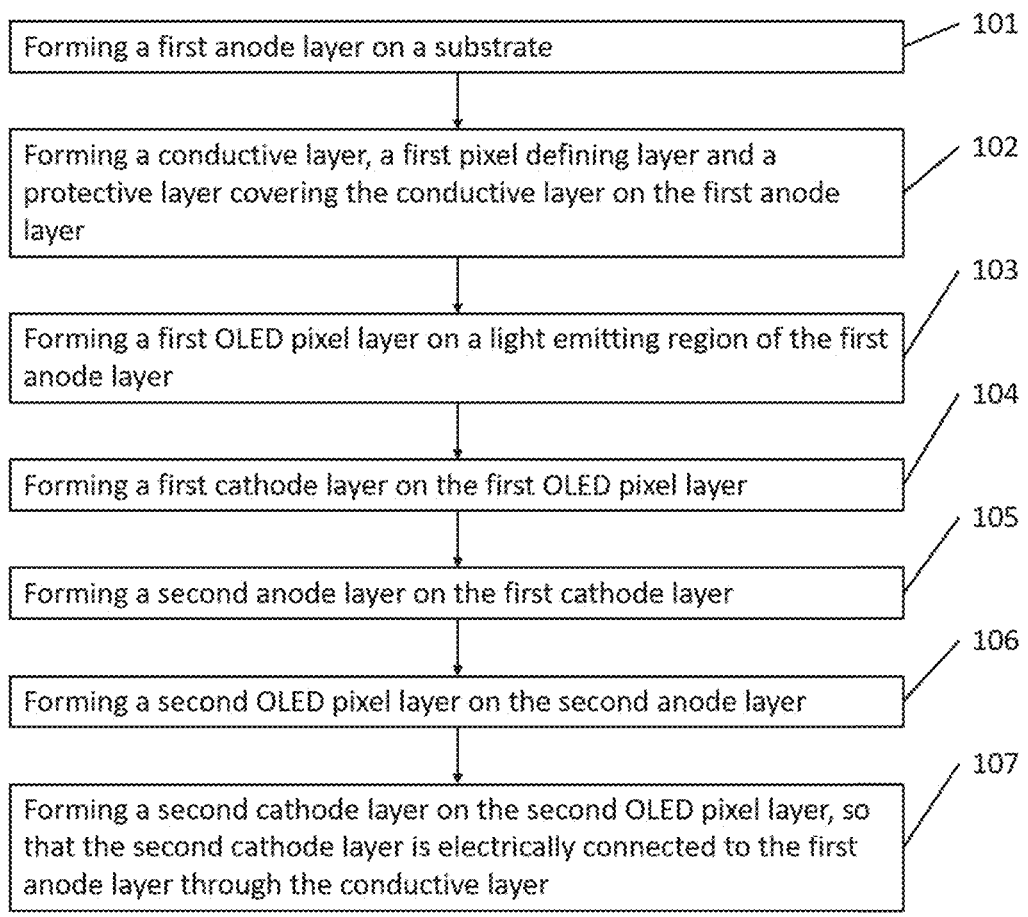
FIG. 1 is a schematic flow chart of an embodiment of a manufacturing method of an OLED display panel of the present disclosure.

Please referring to FIG. 1, FIG. 1 is a schematic flow chart of an embodiment of a manufacturing method of an OLED display panel of the present disclosure. The manufacturing method of an OLED display panel of the present embodiment includes the steps of:

101: forming a first anode layer on a substrate.

Material of the substrate is selected from a combination of any one or more of glass fiber substrate, composite substrate, stack multilayer substrate and special material substrate, which is not limited herein.

Specifically, the first anode layer is formed on the substrate by any one of the processes of vapor deposition and sputtering on the surface of the substrate, the anode array is formed by photolithography, or the anode array is directly formed by printing. In this embodiment, material of the first anode layer is ITO (Indium Tin Oxide).

102: forming a conductive layer, a first pixel defining layer and a protective layer covering the conductive layer on the first anode layer.

In the present embodiment, the conductive layer is formed on the first anode layer by using a mask and a photolithography process. A first end of the conductive layer is connected to the anode layer and the first pixel defining layer is formed on the periphery of the conductive layer and the protective layer covers the second end of the conductive layer. Wherein material of the protective layer may be organic material such as polyimide and phenolic resin, which is not limited herein.

103: forming a first OLED pixel layer on a light emitting region of the first anode layer.

In the present embodiment, the first hole injection layer and the first hole transport layer are sequentially formed on the first transparent anode layer by thermal evaporation, and then the first OLED light emitting layer is formed on the first hole transport layer. The first OLED light emitting layer adopts two colors of three primary colors to be alternately distributed. Finally, the first electron transport layer and the first electron injection layer are sequentially formed on the first OLED light emitting layer.

In other embodiments, the manner of forming the first OLED pixel layer may also be other existing methods, which are not limited herein. However, it is necessary to ensure that the first OLED light emitting layer is formed by alternately distributing two colors among the three primary colors.

104: forming a first cathode layer on the first OLED pixel layer.

In the present embodiment, a transparent material is deposited on the first OLED pixel layer by thermal evaporation to form the first cathode layer. Preferably, material of the first cathode layer is ITO (Indium Tin Oxide). The first cathode layer may also be formed of other transparent materials, which is not limited herein.

105: forming a second anode layer on the first cathode layer.

In the present embodiment, a transparent material is deposited on the first cathode layer by thermal evaporation to form the second anode layer. Preferably, the second anode layer is made of a transparent material and the material is ITO (Indium Tin Oxide). The second anode layer may also be formed of other transparent materials, which is not limited herein.

106: forming a second OLED pixel layer on the second anode layer.

In the present embodiment, the second hole injection layer and the second hole transport layer are sequentially formed on the second transparent anode layer by thermal evaporation, and then the second OLED light emitting layer is formed on the second hole transport layer. Since the two primary colors of the three primary colors have been used during the formation of the first OLED light emitting layer, the remaining one of the primary colors is used for the second OLED light emitting layer. Finally, the first electron transport layer and the second electron injection layer are sequentially formed on the second OLED light emitting layer.

107: forming a second cathode layer on the second OLED pixel layer, so that the second cathode layer is electrically connected to the first anode layer through the conductive layer.

In the present embodiment, removing the protective layer by using the stripping technology in the photolithography technique to expose the second end of the conductive layer; using the glue, exposure, development and other techniques to prepare the second pixel defining layer; using an open mask to form the second cathode layer on the second OLED pixel layer so that the second cathode layer is electrically connected to the first anode layer through the conductive layer. Preferably, the second cathode layer is made of a transparent material, and the material is ITO (Indium Tin Oxide). The method of removing the protective layer and forming the second pixel defining layer may also be other well-known methods in the art, which are not limited herein.

The manufacturing method of the OLED display panel of the present disclosure will be further described in detail below with reference to a specific embodiment.

Figure 2:
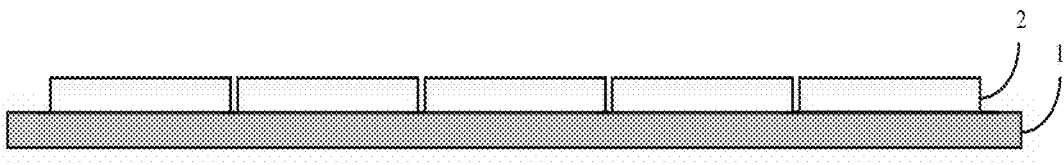
FIG. 2 is a schematic diagram of the product structure after forming the first anode layer on the substrate.
Figure 3:
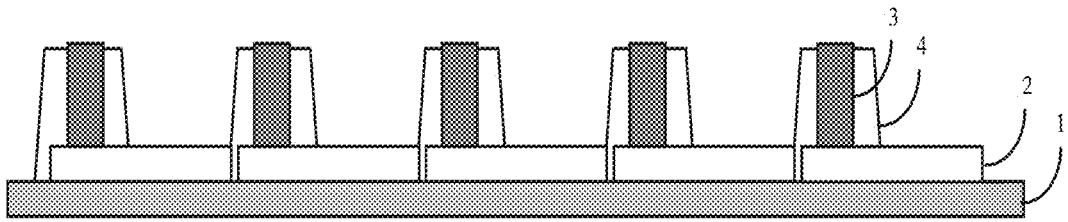
FIG. 3 is a schematic diagram of the product structure after forming the first pixel defining layer on the basis of FIG. 2.
Figure 4:
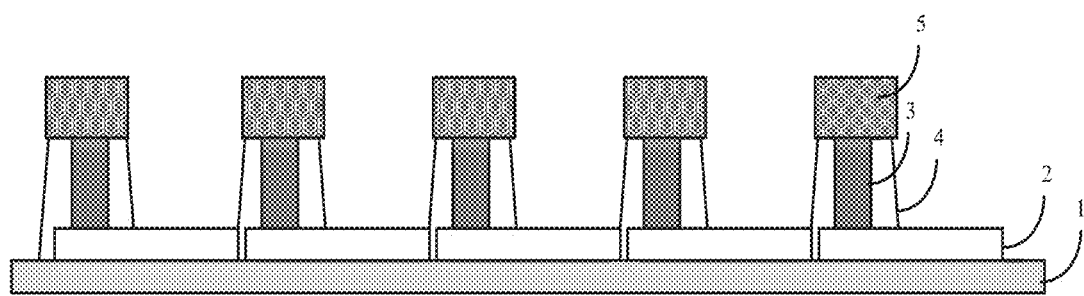
FIG. 4 is a schematic diagram of the product structure after forming the protective layer on the basis of FIG. 3.

Referring to FIG. 2 to FIG. 4, the first anode layer 2 is formed on the surface of the substrate 1 by the evaporation process and then the anode array is formed by photolithography; then, the conductive layer 3, the first pixel defining layer 4 and the protective layer 5 covering the conductive layer 3 are prepared on the substrate by using a mask and a photolithography process. Specifically, the first end of the conductive layer 3 is electrically connected to the first anode layer 2, and the first end of the conductive layer 3 is covered by the protective layer 5.

Figure 5:
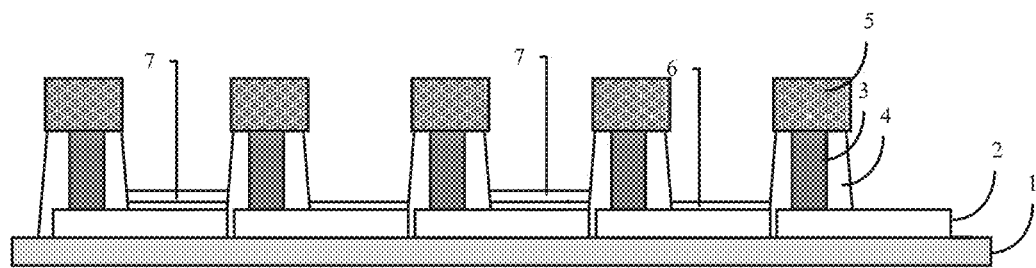
FIG. 5 is a schematic diagram of the product structure after forming the red light emitting layer on the basis of FIG. 4.
Figure 6:
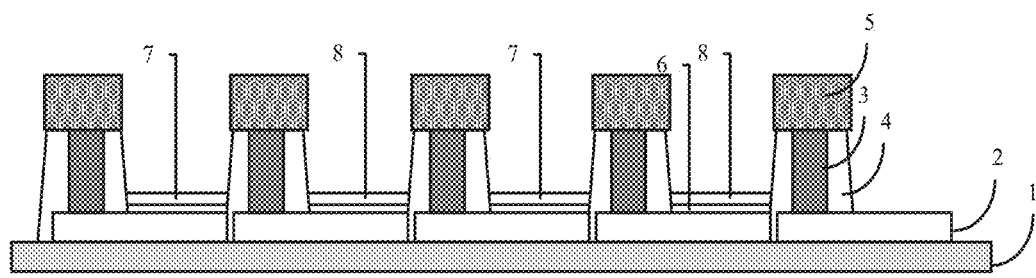
FIG. 6 is a schematic diagram of the product structure after forming the green light emitting layer on the basis of FIG. 5.

Referring to FIG. 5 and FIG. 6, the first hole injection layer 6 and the first hole transport layer (deposited on the first hole injection layer 6, not shown) of the OLED device structure are sequentially deposited on the first anode layer 2 of the substrate by thermal evaporation and then the mask treatment is performed by using the mask OPEN-MASK1; then, the red light emitting layer 7 is deposited on the first hole transport layer by using a precision mask FMM-MASK-R by means of thermal evaporation so that the red light emitting layer is used for the light emitting region of each interval. Finally, the green light emitting layer 8 is deposited in the green light emitting region by means of thermal evaporation on the first hole transport layer with a precision mask FMM-MASK-G, so that the red light emitting layer and the green light emitting layer form an interval distribution.

Figure 7:
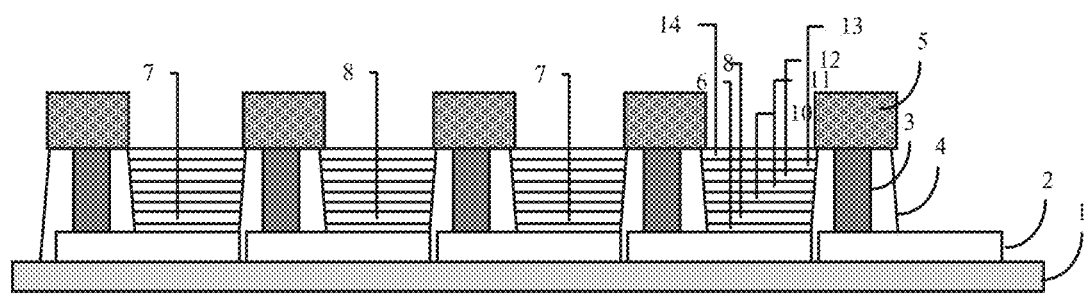
FIG. 7 is a schematic diagram of the product structure after forming the blue light emitting layer on the basis of FIG. 6.
Figures 8, 9, 10:
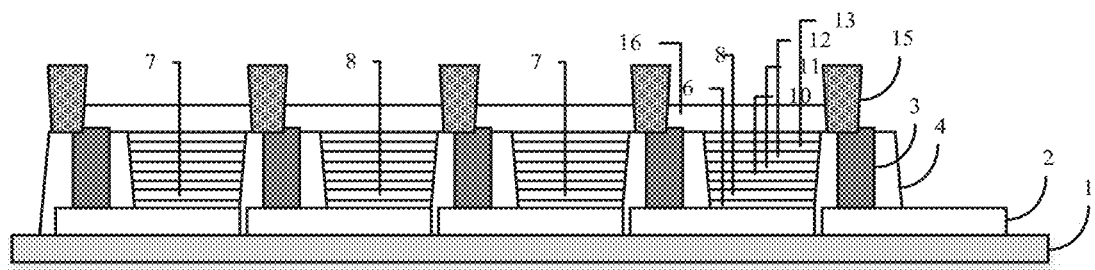
FIG. 8 is a schematic diagram of the product structure after forming the second cathode layer on the basis of FIG. 7.
FIG. 9 is a schematic diagram of the arrangement of the OLED pixel layer according to an embodiment of the present disclosure.
FIG. 10 is a schematic diagram of the arrangement of the OLED pixel layer according to another embodiment of the present disclosure.

Referring to FIG. 7 and FIG. 8, the first electron transport layer and the first electron injection layer (not shown) are deposited on the red light emitting layer 7 and the green light emitting layer 8 respectively by means of thermal evaporation. Wherein the mask is OPEN-MASK1, thereby forming the first OLED pixel layer. The first cathode layer 10 and the second anode layer 11 are formed by sequentially depositing a transparent material on the first OLED pixel layer by means of thermal evaporation, this layer uses another type of mask OPEN-MASK2 to achieve overlap between the electrodes and the surrounding leads. The second hole injection layer 12, the second hole transport layer (deposited on the second hole injection layer, not shown), the blue light emitting layer EML (B) 13, the second electron transport layer 14, and the second electron injection layer (deposited on the second electron transport layer, not shown) are sequentially formed on the second anode layer 11 by repeating the above process, wherein the respective layers use the same type of mask OPEN-MASK1, thereby forming the second OLED pixel layer. Then removing the protective layer by photolithography technology to expose the top of the conductive layer 3; using the glue, exposure, development and other techniques to prepared an inverted trapezoidal second pixel defining layer 15; finally, forming the second cathode layer 16 on the second OLED pixel layer by using the mask OPEN-MASK1.

Referring to FIG. 9, FIG. 9 is the arrangement of the OLED pixel layer according to an embodiment of the present disclosure. The first OLED pixel layer employs red and green among the three primary colors, of which red and green are alternately distributed. The second OLED pixel layer uses the blue of the three primary colors.

Referring to FIG. 10, FIG. 10 is the arrangement of the OLED pixel layer according to another embodiment of the present disclosure. The first OLED pixel layer adopts red and green in three primary colors, wherein two red dots are one group, two green dots are one group, and the red group and the green group are alternately distributed. The second OLED pixel layer uses the blue of the three primary colors.

In other embodiments, the first OLED pixel layer may also adopt red and blue of the three primary colors, and the second OLED pixel layer adopts green of the three primary colors; or the first OLED pixel layer may also adopt green and blue of the three primary colors and the second OLED pixel layer adopts red of the three primary colors.

Further, based on the above embodiments, the third OLED pixel layer may also be stacked again, and the display of the three colors of red, green and blue is completed by a single pixel unit. Specifically, after the second electron transport layer and the second electron injection layer are completed, the second cathode layer, the third anode layer, the third OLED pixel layer and the third cathode layer are sequentially formed on the second electron injection layer. Wherein the third OLED pixel layer includes a third hole injection layer, a third hole transport layer, a light emitting layer, a third electron transport layer, and a third electron injection layer in a stacking order. The color of the light emitting layer is different from the last color of the three primary colors of the first OLED pixel layer and the second OLED pixel layer in the same structure.

In other embodiments, the first OLED pixel layer and the second OLED pixel layer may be first formed by depositing thermal evaporation, and then the first pixel defining layer may be formed by etching. Details are not described herein again.

Different from the prior art, in the present disclosure, the first OLED pixel layer is alternately arranged with two colors of the three primary colors and the second OLED pixel layer is the other one of the three primary colors through the stack structure: at the same time, the OLED display panel is driven by the mode of driving the display of the pixel stack. By the above method, the times of FMM (precision mask plate) used in the manufacturing process is greatly reduced, the process complexity and cost are reduced, and the product yield is improved. At the same time, the space occupied by the stack structure relative to the three primary colors is drastically reduced, greatly improving the pixel resolution.

Figure 11:
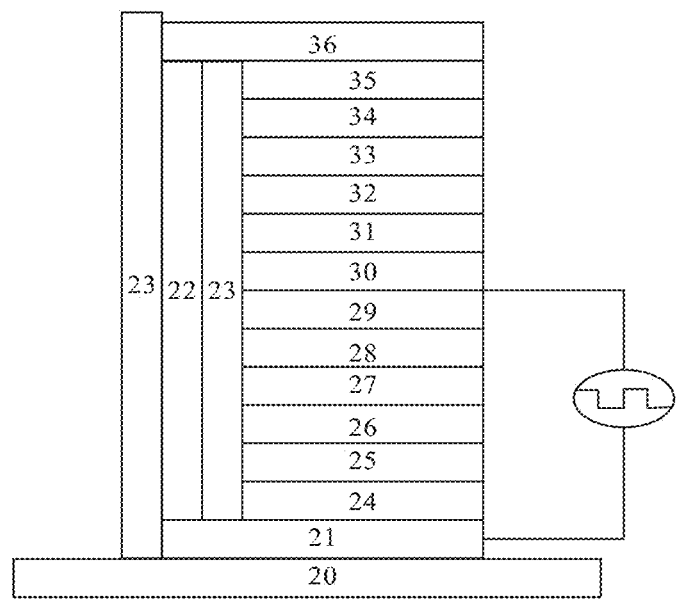
FIG. 11 is a schematic structural diagram of an embodiment of a pixel unit of an OLED display panel according to the present disclosure.

Referring to FIG. 11, FIG. 11 is a schematic structural diagram of an embodiment of a pixel unit of an OLED display panel according to the present disclosure. The OLED display panel includes: a substrate 20, and a first anode layer 21, a conductive layer 22, a first pixel defining layer 23, a first OLED pixel layer (24, 25, 26, 27 and 28), a first cathode layer 29, a second anode layer 30, a second OLED pixel layer (31, 32, 33, 34 and 35) and a second cathode layer 36 formed on the substrate 20 sequentially. Wherein the first pixel defining layer 23 is made of an insulating material, the second cathode layer 36 is electrically connected to the first anode layer 21 through the conductive layer 22. The first OLED pixel layer includes a first hole injection layer 24, a first hole transport layer 25, a first OLED light emitting layer 26, a first electron transport layer 27, and a first electron injection layer 28. The second OLED pixel layer includes a second hole injection layer 31, a second hole transport layer 32, a second OLED light emitting layer 33, a second electron transport layer 34, and a second electron injection layer 35. Wherein the first OLED light emitting layer is alternately arranged with two colors of the three primary colors. The first cathode layer 29, the second anode layer 30 and the second cathode layer 36 are formed of a transparent material.

In the present embodiment, material of the first cathode layer 29, the second anode layer 30 and the second cathode layer 36 is ITO (Indium Tin Oxide). In other embodiments, other transparent conductive materials may also be used, which are not limited herein.

In the present embodiment, in order to increase the luminous efficiency of the device, the first hole injection layer 24, the first hole transport layer 25, the second hole injection layer 31 and the second hole transport layer 32 need to be filled with metals such as Ag, Al, Ca, Li and Mg, or other low work function composite metal.

In a specific embodiment, referring to FIG. 11, the first light emitting layer 26 alternately uses a red light emitting material and a green light emitting material in an interval distribution manner, and all the second light emitting layer 33 uses a blue light emitting material. When red or green light is required, a driving voltage is applied to both ends of the first OLED pixel layer (24, 25, 26, 27 and 28), and the first cathode layer 29 outputs electrons to the first electron transport layer 27 and the first electron injection layer 28, the first anode layer 21 receives electrons through the first hole injection layer 24 and the first hole transport layer 25 and bonds electrons to the holes on the first hole injection layer 24 and the first hole transport layer 25. When electrons encounter holes, they actively fill the energy level of the electron-deficient atoms, so that the first light emitting layer 26 emits red or green light. Similarly, when blue light is needed, a driving voltage is applied to both ends of the second OLED pixel layer (31, 32, 33, 34 and 35), the second cathode layer 36 outputs electrons to the second electron transport layer 34 and the second electron injection layer 35, and the second anode layer 30 receives electrons through the second hole injection layer 31 and the second hole transport layer 32 so as to emit blue light in the second light-emitting layer 33. When the composite light is needed, the first OLED pixel layer (24, 25, 26, 27 and 28) and the second OLED pixel layer (31, 32, 33, 34 and 35) in the OLED display panel structure independently emit the color light by adjusting the amplitudes of the positive-negative frequency pulse voltage and the current signal, at the same time, the device emits a plurality of composite lights of different colors in the stack structure so as to realize the composite color light emitted by the single pixel structure.

Different from the prior art, in the present disclosure, the first OLED pixel layer is alternately arranged with two colors of the three primary colors and the second OLED pixel layer is the other one of the three primary colors through the stack structure; at the same time, the OLED display panel is driven by the mode of driving the display of the pixel stack. By the above method, the times of FMM (precision mask plate) used in the manufacturing process is greatly reduced, the process complexity and cost are reduced, and the product yield is improved. At the same time, the space occupied by the stack structure relative to the three primary colors is drastically reduced, greatly improving the pixel resolution.

The foregoing descriptions are merely embodiments of the present disclosure, and do not limit the scope of the present disclosure. Any equivalent structures or equivalent changes made using the contents of the specification and drawings of the present disclosure or directly or indirectly applied to other related technical fields shall be similarly included in the scope of the patent protection of the present disclosure.

What is claimed is:

1. A manufacturing method of an OLED display panel, comprising the steps of:
   forming a first anode layer on a substrate;
   forming a conductive layer on the first anode layer, wherein a first end of the conductive layer is electrically connected to the first anode layer;
   forming a first pixel defining layer on the periphery of the conductive layer;
   covering a second end of the conductive layer with a protective layer;
   forming a first OLED pixel layer on the first anode layer;
   forming a first cathode layer on the first OLED pixel layer;
   forming a second anode layer on the first cathode layer;
   forming a second OLED pixel layer on the second anode layer;
   removing the protective layer;
   forming a second pixel defining layer; and
   forming a second cathode layer on the second OLED pixel layer, so that the second cathode layer is electrically connected to the first anode layer through the conductive layer.

2. The manufacturing method of an OLED display panel according to claim 1, wherein the first cathode layer, the second anode layer and the second cathode layer are formed of a transparent material.

3. The manufacturing method of an OLED display panel according to claim 1, wherein the step of covering a second end of the conductive layer with a protective layer specifically comprises:
   removing the protective layer by using a stripping technology to expose the second end of the conductive layer;
   forming the second pixel defining layer by using gluing, exposing and developing technologies; and
   forming the second cathode layer on the second OLED pixel layer by using an open mask, so that the second cathode layer is electrically connected to the first anode layer through the conductive layer.

4. The manufacturing method of an OLED display panel according to claim 1, wherein the step of forming a first OLED pixel layer on the first anode layer specifically comprises:
   sequentially forming a first hole injection layer and a first hole transport layer on the first anode layer and a first OLED light emitting layer on the first hole transport layer; and
   forming a first electron transport layer and a first electron injection layer on the first OLED light emitting layer; and the step of forming a second OLED pixel layer on the second anode layer specifically comprises:
   sequentially forming a second hole injection layer and a second hole transport layer on the second anode layer and a second OLED light emitting layer on the second hole transport layer; and
   forming a second electron transport layer and a second electron injection layer on the second OLED light emitting layer.

5. The manufacturing method of an OLED display panel according to claim 1, wherein the first OLED light emitting layer is alternately arranged with two colors of the three primary colors.

6. A manufacturing method of an OLED display panel, comprising the steps of:
   forming a first anode layer on a substrate;
   forming a conductive layer, a first pixel defining layer and a protective layer covering the conductive layer on the first anode layer;
   forming a first OLED pixel layer on the first anode layer;

forming a first cathode layer on the OLED pixel layer;
forming a second anode layer on the first cathode layer;
forming a second OLED pixel layer on the second anode layer; and
forming a second cathode layer on the second OLED pixel layer, so that the second cathode layer is electrically connected to the first anode layer through the conductive layer.

7. The manufacturing method of an OLED display panel according to claim 6, wherein the first cathode layer, the second anode layer and the second cathode layer are formed of a transparent material.

8. The manufacturing method of an OLED display panel according to claim 6, wherein the step of forming a conductive layer, a first pixel defining layer and a protective layer covering the conductive layer on the first anode layer specifically comprises:
　　forming the conductive layer on the first anode layer, wherein a first end of the conductive layer is electrically connected to the first anode layer;
　　forming the first pixel defining layer on the periphery of the conductive layer; and
　　covering a second end of the conductive layer with the protective layer.

9. The manufacturing method of an OLED display panel according to claim 6, wherein the step of forming a second cathode layer on the second OLED pixel layer, so that the second cathode layer is electrically connected to the first anode layer through the conductive layer specifically comprises:
　　removing the protective layer;
　　forming a second pixel defining layer; and
　　forming the second cathode layer on the second OLED pixel layer, so that the second cathode layer is electrically connected to the first anode layer through the conductive layer.

10. The manufacturing method of an OLED display panel according to claim 6, wherein the step of forming a conductive layer, a first pixel defining layer and a protective layer covering the conductive layer on the first anode layer specifically comprises:
　　removing the protective layer by using a stripping technology to expose the second end of the conductive layer;
　　forming the second pixel defining layer by using gluing, exposing and developing technologies; and
　　forming the second cathode layer on the second OLED pixel layer by using an open mask, so that the second cathode layer is electrically connected to the first anode layer through the conductive layer.

11. The manufacturing method of an OLED display panel according to claim 6, wherein the step of forming a first OLED pixel layer on the first anode layer specifically comprises:
　　sequentially forming a first hole injection layer and a first hole transport layer on the first anode layer and a first OLED light emitting layer on the first hole transport layer; and
　　forming a first electron transport layer and a first electron injection layer on the first OLED light emitting layer;
　　and the step of forming a second OLED pixel layer on the second anode layer specifically comprises:
　　sequentially forming a second hole injection layer and a second hole transport layer on the second anode layer and a second OLED light emitting layer on the second hole transport layer; and
　　forming a second electron transport layer and a second electron injection layer on the second OLED light emitting layer.

12. The manufacturing method of an OLED display panel according to claim 6, wherein the first OLED light emitting layer is alternately arranged with two colors of the three primary colors.

\* \* \* \* \*